(12) United States Patent
Dargis et al.

(10) Patent No.: US 8,748,900 B1
(45) Date of Patent: Jun. 10, 2014

(54) RE-SILICIDE GATE ELECTRODE FOR III-N DEVICE ON SI SUBSTRATE

(71) Applicant: Translucent, Inc., Palo Alto, CA (US)

(72) Inventors: Rytis Dargis, Fremont, CA (US);
Andrew Clark, Los Altos, CA (US);
Erdem Arkun, San Carlos, CA (US);
Robin Smith, Palo Alto, CA (US);
Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 13/851,219

(22) Filed: Mar. 27, 2013

(51) Int. Cl.
*H01L 23/58* (2006.01)
*H01L 21/26* (2006.01)
*H01L 21/32* (2006.01)

(52) U.S. Cl.
USPC ............. 257/76; 438/604; 438/478; 438/676

(58) Field of Classification Search
CPC .......... H01L 33/32; H01L 33/60; H01L 29/04
USPC .......... 438/478, 493, 604; 257/11, 22, 76, 79, 257/89, 189, 190, 61, E21.09, E21.097, 257/E21.117, E21.127, E21.157, E21.386
See application file for complete search history.

(56) References Cited

U.S. PATENT DOCUMENTS

2005/0161663 A1* 7/2005 Atanackovic ................... 257/19
2011/0062446 A1* 3/2011 Goyal ............................. 257/64

OTHER PUBLICATIONS

Lee et al., "GaN on Si with nm—thick single—crystal Sc203 as a template using molecular beam epitaxy" Journal of Crystal Growth, 311 (2009) 2006-2009.*
Hong et al "Single Crystal . . . GaN" 2000 IEEE Int. Symp. on Compound Semiconductors, Oct. 2-5, 2000, pp. 495-500.*

* cited by examiner

*Primary Examiner* — Yuanda Zhang
*Assistant Examiner* — Sheikh Maruf
(74) *Attorney, Agent, or Firm* — Parsons & Goltry; Robert A. Parsons; Michael W. Goltry

(57) ABSTRACT

A method of fabricating a rare earth silicide gate electrode on III-N material grown on a silicon substrate includes growing a single crystal stress compensating template on a silicon substrate. The template is substantially crystal lattice matched to the surface of the silicon substrate. A single crystal GaN structure is grown on the surface of the template and substantially crystal lattice matched to the template. An active layer of single crystal III-N material is grown on the GaN structure and substantially crystal lattice matched to the GaN structure. A single crystal monoclinic rare earth oxide dielectric layer is grown on the active layer of III-N material and a single crystal rare earth silicide gate electrode is grown on the dielectric layer, the silicide. Relative portions of the gadolinium metal and the silicon are adjusted during deposition so they react to form rare earth silicide during deposition.

20 Claims, 4 Drawing Sheets

US 8,748,900 B1

RE-SILICIDE GATE ELECTRODE FOR III-N DEVICE ON SI SUBSTRATE

FIELD OF THE INVENTION

This invention relates in general to the growth of a III-N device on a silicon substrate and in particular the in-situ growth of a gate electrode on the device.

BACKGROUND OF THE INVENTION

It is known that III-N based devices, such as GaN semiconductor devices, grown on a silicon substrate require gate dielectric material with sufficient dielectric constant and a proper band offset for good operating characteristics, e.g. low leakage currents and good gate control. In the prior art some attempts at using high-k polycrystalline materials have been unsuccessful. For example, polycrystalline $Hf_2O_3$ has been proposed for a gate dielectric. However, the material was found to be unsuitable because of leakage current paths via nanocrystallite grain boundaries and because of crystal defects induced high interface state density which deteriorate electrical properties of the material.

In the semiconductor industry, it is also known that growing a III-N material, such as GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. Generally, the prior art buffer layers are either, complicated and expensive to form or do no adequately reduce the strain in the GaN due to crystal lattice mismatch.

Further, once a semiconductor device is formed in the III-N material with improved gate dielectric material a gate electrode is formed. In the prior art the gate electrode was formed by some metallization process in which Ti/Al/Au based material was deposited. This deposition is expensive and requires at least one additional step in the fabrication.

It would be highly advantageous, therefore, to remedy the foregoing and other deficiencies inherent in the prior art.

Accordingly, it is an object of the present invention to provide a new and improved gate electrode for III-N devices on silicon substrates.

It is another object of the present invention to provide new and improved methods for the formation of a gate electrode in III-N devices on silicon substrates.

It is another object of the present invention to provide new and improved methods for the growth of III-N devices on a silicon substrate that includes substantially reducing strain in the active III-N material as well as the formation of a gate dielectric and a gate electrode in one continuous (in-situ) operation.

It is another object of the present invention to provide a new and improved gate electrode for III-N devices.

SUMMARY OF THE INVENTION

Briefly, the desired objects and aspects of the instant invention are realized in accordance with a method of fabricating a rare earth silicide gate electrode on III-N material grown on a silicon substrate. The method includes growing a single crystal stress compensating template on a silicon substrate. The template is substantially crystal lattice matched to the surface of the silicon substrate. A single crystal GaN structure is grown on the surface of the template and substantially crystal lattice matched to the template. An active layer of single crystal III-N material is grown on the GaN structure and substantially crystal lattice matched to the GaN structure. A single crystal monoclinic rare earth oxide dielectric layer is grown on the active layer of III-N material and a single crystal rare earth silicide gate electrode is grown on the dielectric layer. Relative portions of the rare earth metal and the silicon are adjusted during deposition so they react to form gadolinium silicide during deposition.

The desired objects and aspects of the instant invention are further achieved in accordance with a rare earth silicide gate electrode on III-N material grown on a silicon substrate including a single crystal stress compensating template positioned on a silicon substrate and substantially lattice matched to the surface of the silicon substrate. A GaN structure is positioned on the surface of the stress compensating template and substantially lattice matched to the single crystal stress compensating template. An active layer of single crystal III-N material is grown on the GaN structure and substantially crystal lattice matched to the GaN structure. A single crystal monoclinic rare earth oxide dielectric layer is epitaxially grown on the active layer of III-N material and a single crystal rare earth silicide gate electrode is epitaxially grown on the single crystal rare earth oxide dielectric layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
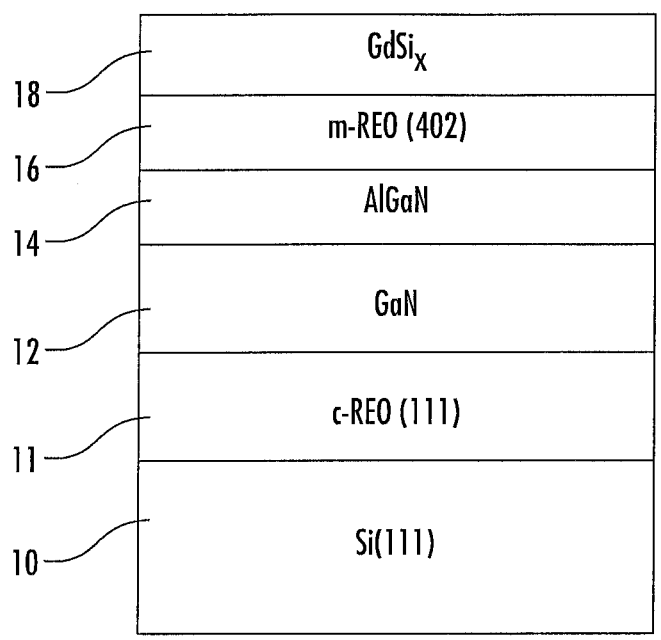
FIG. 1 is a simplified layer diagram illustrating a REO gate electrode on a III-N device with a stress compensating REO template, in accordance with the present invention.

Turning to FIG. 1, a simplified layer diagram is illustrated representing several steps in a process of fabricating a semiconductor device 19 including a REO gate electrode 18 on a REO gate dielectric 16 on a III-N active layer 14 with a stress compensating REO template 11 on a silicon substrate 10, in accordance with the present invention. It will be understood that silicon substrate 10 is or may be a standard well known single crystal wafer or portion thereof generally known and used in the semiconductor industry. Single crystal substrates, it will be understood, are not limited to any specific crystal orientation but could include (111) silicon, (110) silicon, (100) silicon or any other orientation or variation known and used in the art. The Si (100) and (111) substrates could also include various miscuts with nominal value between 0 and 10° in any direction. However, throughout this disclosure substrate 10 is illustrated with a preferred (111) orientation because of the simplification of further operations.

Stress compensating REO template 11 of rare earth oxide (REO) is epitaxially grown on silicon substrate 10. Various rare earth oxides have a crystal lattice spacing that can be matched to silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. Further, the crystal lattice spacing of REO template 11 can be varied by varying the composition of the constituents, which allows for strain engineering of the silicon wafers. Generally, the REO material closest to or adjacent silicon substrate 10 will have a crystal spacing closest to the crystal spacing of silicon while REO materials adjacent the opposite (upper) side of REO template 11 will have a crystal spacing closer to the crystal spacing of materials grown on the surface. Also, at least the portion of REO template 11 adjacent silicon substrate 10 has a cubic crystal formation to match the crystal formation of silicon substrate 10. Basically, REO template 11 is a stress compensating template including one or more sub-layers (stepped or graded) of rare earth oxide defining, in conjunction with substrate 10 a "substrate structure". Strain engineering mitigates the stresses formed during growth of III-N materials and devices on these substrate structures.

In one specific example, REO template 11 includes $Gd_2O_3$ epitaxially grown on silicon substrate 10 with $Er_2O_3$ epitaxially grown adjacent the opposite (upper) side. The REO materials can be grown in a graded fashion bridging the two compositions or split to have an abrupt change in the composition and/or constituents of REO template 11. Also, while two constituents are used in this example other and/or additional rare earth oxides can be included in REO template 11. Also, REO template 11 can be formed with a single continuous composition or it can be graded, in linear, stepwise or any similar schemes.

Figure 2:
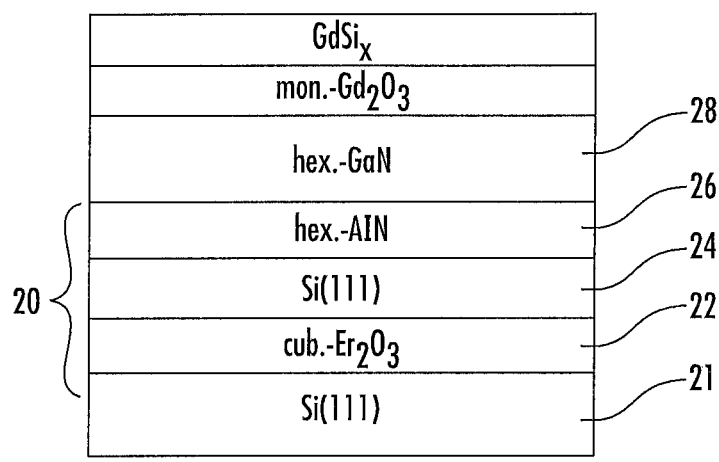
FIG. 2 is a simplified layer diagram illustrating a specific example of a REO and Si stress compensating template.

Referring additionally to FIG. 2, another example of a REO template, designated 20, is illustrated. In this example a layer 22 of single crystal cubic REO material, such as erbium oxide (or any other cubic rare earth oxides with an atomic number larger than gadolinium), is epitaxially grown on a silicon substrate 21. Silicon substrate 21 is similar to substrate 10 described above. Layer 22 of single crystal cubic REO material has a crystal lattice spacing approximately −3% (see explanation above) different than the double lattice spacing of silicon. A thin layer 24 of single crystal silicon is epitaxially grown on single crystal layer 22 and, because of the negative mismatch has a lattice spacing that is stretched to more closely match the spacing of single crystal layer 22, i.e. layer 24 of the epitaxial silicon has a negative spacing mismatch compared to spacing of substrate 21.

A thin layer 26 of AlN is epitaxially grown on layer 24 of epitaxial silicon. AlN layer 26 has a hexagonal crystal structure in which five lattice spacings are misfit from four standard silicon lattice spacings by −1.2%. While this is sufficient to allow lattice coincident epitaxy, layer 24 of epitaxial silicon further reduces this misfit (i.e. below −1.2%) so that better lattice matching is achieved with further reduction of dislocation density in AlN layer 26. For purposes of this disclosure, the term "substantially lattice matched" is defined to include a misfit lattice spacing of less than approximately −1.2%, i.e. the 5:4 ratio is improved.

A layer 28 of GaN is epitaxially grown on AlN layer 26 which is illustrated as layer 12 in FIG. 1. GaN layer 28 has a hexagonal crystal structure which closely matches the hexagonal crystal structure of AlN. A thicker active layer of III-N material (layer 14 in FIG. 1) can then be epitaxially grown on layer 28 or, for some applications, GaN layer 28 can simply be grown thicker to serve as an active layer. It should also be noted that any gallium containing layer cannot be grown on silicon because gallium etches silicon and cannot touch silicon. Thus, the example described (AlN layer 26) also protects the silicon from the gallium.

With reference again to FIG. 1, the rare earth oxide is impervious to MBE process gasses, i.e. $N_2$ plasma, $NH_3$ and metallic Ga, which is the preferred growth process in this invention. Also, in the event that other growth processes are used, such as the MOCVD process, the rare earth oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursor). Thus silicon substrate 10 is protected from damage caused by generally all growth process gasses by rare earth oxide layer 11.

A gallium nitride (GaN) layer 12 is epitaxially grown on rare earth oxide template 11 preferably by an MBE process. Generally, GaN layer 12 will be in a range of 50 nm to 100 nm thick, although thicker or thinner layers can be grown. Because there will still be some strain in GaN layer 12, i.e. the crystal lattice junction with REO template 11 still produces some strain, a thinner layer 12 of GaN is preferred. Also, any of the structures outlined below for further reducing stress can optionally be included if desired.

As explained in a copending U.S. patent application entitled "AlN Inter-Layers in III-N Material Grown on REO/Silicon Substrate", Ser. No. 13/742,590, filed on Jan. 16, 2013, and incorporated herein by reference, a thin inter-layer of aluminum nitride (AlN) is epitaxially grown on the GaN layer to further reduce the strain. Preferably, the AlN inter-layer is in a range of approximately 1 nm to approximately 10 nm thick but for certain applications thicker or thinner films can be grown. Also, the AlN inter-layer can be grown using either a low or a high temperature process. A second layer of GaN is epitaxially grown on the AlN inter-layer. A second inter-layer of AlN is grown on the second GaN layer and this process is repeated n times or until the strain in the upper GaN or III-N layer has been reduced to an acceptable level. Basically, the strain formed during the growth of the GaN is controlled by insertion of the thin inter-layers of AlN, each of which allows the following layer of GaN to be under compressive stress due to the pseudomorphic growth at the interface. Repeating the process (i.e. the alternating growth of the GaN layers and the interlayers of AlN) n times can be used to further reduce or engineer strain in a final GaN or III-N layer.

With a relatively stress free upper layer 12 of GaN in place, a layer 14 of III-N semiconductor material, in this preferred example ALGaN, is epitaxially grown on layer 12. Layer 14 of III-N semiconductor material forms an active layer for semiconductor devices built on/in the surface thereof. Because III-N layer 14 is grown with very little stress due to the layers and/or templates described above, it can be grown sufficiently thick to conveniently form electronic devices therein.

In a preferred method, a gate dielectric layer 16 is epitaxially grown on the upper surface of III-N layer 14. Gate dielectric layer 16 is not crystal lattice matched to the III-N material of layer 14 because the lattice constant of the rare earth oxide is larger than the III-N material. However, the REO material is single crystal and is polymorphous which means the crystal structure is different than the crystal structure of bulk REO material. Bulk REO material normally has a cubic structure (the type of rare earth oxide used in the present case) while the crystal structure of the REO in gate dielectric layer 16 is monoclinic because it is grown on III-N layer 14 which has a hexagonal crystal structure.

Because gate dielectric layer 16 is epitaxially grown on the upper surface of III-N layer 14, the various layers can be grown in situ, that is without removing the structure from the growth chamber, which substantially simplifies the method. Further, there may be an advantage in using the same materials for REO template 11 and gate dielectric layer 16. This can be accomplished relatively easily when template 20 is used since it includes a single layer of REO material. Thus, the entire structure including template 11 and, layers 12, 14, and 16 can be grown on substrate 10 in one continuous operation. Layer 16 serves as a high k gate dielectric layer for a device formed thereon, such as a field effect transistor or the like. Also, because layer 16 is a single crystal material dangling bonds that could act as charge trap centers in any device are substantially avoided.

REO gate electrode 18 is epitaxially deposited on REO gate dielectric 16 so as to form a layer of rare earth silicide. Rare earth silicides have high conductivity and are capable of forming good gate electrodes in physical contact with REO gate dielectric 16. The selected rare earth metal and silicon are deposited in adjusted portions so that they react to form the rare earth silicide during deposition. Adjustments of silicon to rare earth metal atomic ratio of 1.7 to 2 are possible, although 1.7 is optimal (e.g. $ErSi_{1.7}$ resistivity is as low as 34 $\mu\Omega cm$ which is an advantage for contact material). In a preferred embodiment REO gate dielectric 16 includes monoclinic $Gd_2O_3$ and REO gate electrode 18 includes the silicide $GdSi_x$. The co-deposition of rare earth metal and silicon allows the formation of the gate electrode on materials different than Si or $SiO_2$. This is in contrast to prior art methods which use a solid state reaction in which rare earth metal is deposited on a layer of silicon or silicon dioxide and the structure is annealed until silicide is formed. This prior art method is cumbersome and requires several additional steps to arrive at a desired result. In the present process the rare earth silicide can be deposited in situ after the deposition of REO gate dielectric 16.

With gate electrode 18 positioned on REO gate dielectric 16, a source and a drain can be formed in III-N active layer 14 by any well known method, such as implanting dopants. In a typical procedure gate electrode 18 and gate dielectric layer 16 are masked to define a channel in active layer 16 and the source/drain implants are automatically aligned. Source/drain contacts can then be formed in a typical metallization process. While this description only illustrates a single Field Effect Transistor (FET) for a complete understanding, it will be understood that anything from discrete devices to complete circuits can be formed using the same methods.

Figure 3:
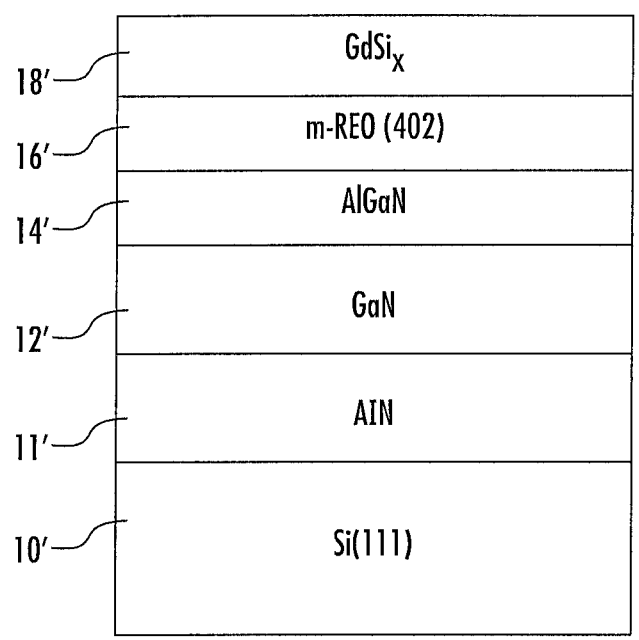
FIG. 3 is a simplified layer diagram illustrating a REO gate electrode on a III-N device with a stress compensating AlN template, in accordance with the present invention.

Turning now to FIG. 3, an example is illustrated of a III-N device 19' formed on another stress compensating template 11', in accordance with the present invention. In this example components that are similar to components in FIG. 1 are designated with a similar number having a prime (') added to indicate the different example. In this example, the stress compensating template including cubic rare earth oxide (layer 11) is replaced with an AlN stress compensating layer 11'. Layer 11' includes one or more layers including AlN and the layers can be stepped or graded in a well known process. Generally, a thin layer of AlN is epitaxially grown on silicon substrate 10'. Because of the 5:4 lattice ratio, the AlN has reduced defect density. The AlN layer has a hexagonal crystal structure in which five lattice spacings are misfit from four standard silicon lattice spacings by −1.2%. This is sufficient to allow lattice coincident epitaxy so that substantial lattice matching is achieved with reduction of dislocation density in the AlN layer. For purposes of this disclosure, the term "substantially lattice matched" is defined to include a misfit lattice spacing of less than approximately −1.2%, i.e. the 5:4 ratio is improved.

In some specific applications AlN stress compensating layer 11' may include or be replaced with a single crystal electrically insulating buffer positioned on the silicon substrate. The single crystal buffer includes rare earth aluminum nitride (REAlN) and has a lattice co-incidence between the REAlN and Si better than a 5:4 ratio so that the buffer is substantially crystal lattice matched to the surface of the silicon substrate. More details as to this structure are available in a copending U.S. patent application entitled "III-N Material Grown on ErAlN Buffer on Si Substrate", filed on Mar. 4, 2013, bearing Ser. No. 13/784,568, and incorporated herein by reference.

Figure 4:
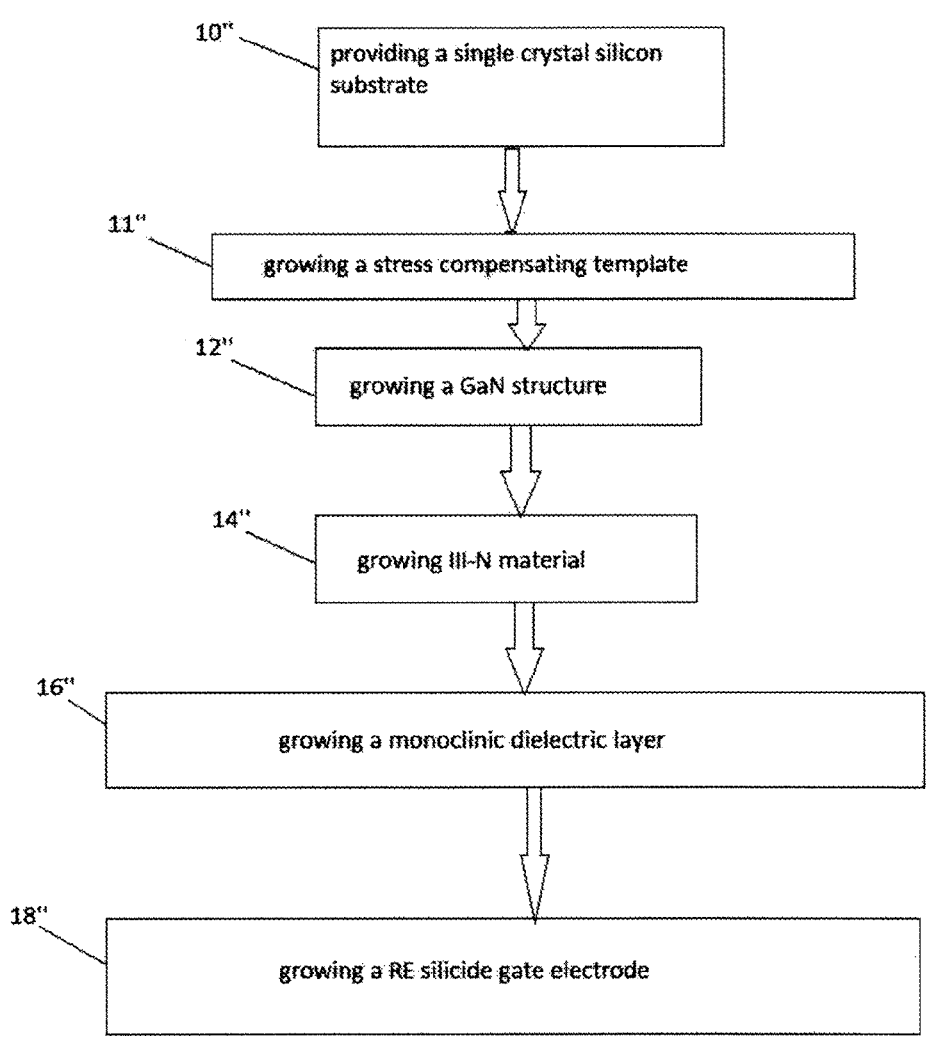
FIG. 4 is a flow chart illustrating the method of fabricating a REO gate electrode on a III-N device with a stress compensating REO template, in accordance with the present invention.

Referring specifically to FIG. 4, a step-by-step method, designated 19", of fabricating a rare earth silicide gate electrode on III-N material on a silicon substrate is illustrated. A first step, designated 10", includes providing a single crystal silicon substrate. A second step, designated 11", includes growing or depositing a single crystal stress compensating template on the silicon substrate substantially crystal lattice matched to the surface of the silicon substrate. A third step, designated 12", includes growing or depositing a single crystal GaN structure on the surface of the stress compensating template substantially crystal lattice matched to the single crystal stress compensating template. A fourth step, designated 14", includes growing or depositing an active layer of single crystal III-N material on the GaN structure substantially crystal lattice matched to the GaN structure. A fifth step, designated 16", includes growing or depositing a single crystal monoclinic rare earth oxide dielectric layer on the active layer of III-N material. A sixth step, designated 18", includes growing or depositing a single crystal rare earth silicide gate electrode on the dielectric layer.

Thus, new and improved methods for the growth of rare earth silicide gate electrodes on III-N material devices on a silicon substrate are disclosed. The new and improved methods for the III-N material devices include the growth of a stress compensating template grown epitaxially on the silicon substrate. The growth of the rare earth silicide gate electrode and the growth of the high k rare earth gate dielectric layer epitaxially on the substantially stress free III-N layer can be a continuous or in situ operation. The rare earth gate material of the electrode is a high conductivity rare earth silicide and the rare earth gate dielectric layer has sufficient dielectric constant and a proper bandwidth offset for the formation of high performance electronic components, such as FETs and the like, in the III-N layer.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of fabricating a rare earth silicide gate electrode on III-N material grown on a silicon substrate comprising the steps of:
   providing a single crystal silicon substrate;
   growing or depositing a single crystal stress compensating template on the silicon substrate, the stress compensating template being substantially crystal lattice matched to the surface of the silicon substrate;
   growing or depositing a single crystal GaN structure on the surface of the stress compensating template, the GaN structure being substantially crystal lattice matched to the single crystal stress compensating template;

growing or depositing an active layer of single crystal III-N material on the GaN structure, the single crystal III-N material being substantially crystal lattice matched to the GaN structure;

growing or depositing a single crystal monoclinic rare earth oxide dielectric layer on the active layer of III-N material; and growing or depositing a single crystal rare earth silicide gate electrode on the dielectric layer.

2. The method as claimed in claim 1 wherein the step of growing or depositing the single crystal monoclinic rare earth oxide dielectric layer and the step of growing or depositing the single crystal rare earth silicide gate electrode both include growing or depositing the same rare earth metal.

3. The method as claimed in claim 1 wherein the step of growing or depositing the single crystal rare earth silicide includes selecting a rare earth metal and silicon and depositing the selected rare earth metal and the silicon in adjusted portions so that they react to form the rare earth silicide.

4. The method as claimed in claim 3 wherein the step of growing or depositing the single crystal rare earth silicide includes adjusting the silicon to rare earth metal to an atomic ratio in a range of 1.7 to 2 although 1.7 is optimal.

5. The method as claimed in claim 4 wherein the step of selecting a rare earth metal includes selecting one of gadolinium or erbium.

6. The method as claimed in claim 5 wherein the step of growing or depositing erbium includes adjusting the erbium to silicon to a ratio of $ErSi_{1.7}$.

7. The method as claimed in claim 1 wherein the steps of growing or depositing the single crystal stress compensating template, growing or depositing the single crystal GaN structure, growing or depositing an active layer, growing or depositing the single crystal monoclinic rare earth oxide dielectric layer, and growing or depositing the single crystal rare earth silicide gate electrode are all performed epitaxially.

8. The method as claimed in claim 7 wherein the steps of growing or depositing the single crystal stress compensating template, growing or depositing the single crystal GaN structure, growing or depositing an active layer, growing or depositing the single crystal monoclinic rare earth oxide dielectric layer, and growing or depositing the single crystal rare earth silicide gate electrode are all performed using an MBE process.

9. The method as claimed in claim 8 wherein the steps of growing or depositing the single crystal stress compensating template, growing or depositing the single crystal GaN structure, growing or depositing an active layer, growing or depositing the single crystal monoclinic rare earth oxide dielectric layer, and growing or depositing the single crystal rare earth silicide gate electrode are all performed in situ.

10. The method as claimed in claim 1 wherein the step of growing or depositing the single crystal rare earth silicide gate electrode includes depositing a rare earth metal and silicon in adjusted portions so that the rare earth metal and the silicon react to form the rare earth silicide during deposition.

11. The method as claimed in claim 1 wherein the step of epitaxially growing the single crystal stress compensating template includes epitaxially growing one or more layers of single crystal rare earth oxide with different compositions of rare earth metals.

12. The method as claimed in claim 1 wherein the step of epitaxially growing the single crystal stress compensating template includes epitaxial growing a layer of rare earth oxide with a cubic crystal structure on the substrate, epitaxial growing a layer of silicon on the layer of rare earth oxide, and epitaxial growing a layer of AlN with a hexagonal crystal structure on the epitaxial layer of silicon.

13. A method of fabricating a rare earth silicide gate electrode on III-N material grown on a silicon substrate comprising the steps of:

providing a single crystal silicon substrate;

epitaxially growing a single crystal stress compensating template on the silicon substrate, the stress compensating template being substantially crystal lattice matched to the surface of the silicon substrate;

epitaxially growing a single crystal GaN structure on the surface of the stress compensating template, the GaN structure being substantially crystal lattice matched to the single crystal stress compensating template;

epitaxially growing an active layer of single crystal III-N material on the GaN structure, the single crystal III-N material being substantially crystal lattice matched to the GaN structure;

epitaxially growing a single crystal monoclinic gadolinium oxide dielectric layer on the active layer of III-N material; and epitaxially growing a single crystal gadolinium silicide gate electrode on the dielectric layer including depositing gadolinium metal and silicon in adjusted portions so that the gadolinium metal and the silicon react to form gadolinium silicide during deposition.

14. The method as claimed in claim 13 wherein the steps of growing or depositing the single crystal stress compensating template, growing or depositing the single crystal GaN structure, growing or depositing an active layer, growing or depositing the single crystal monoclinic gadolinium oxide dielectric layer, and growing or depositing the single crystal gadolinium silicide gate electrode are all performed using an MBE process.

15. The method as claimed in claim 13 wherein the steps of growing or depositing the single crystal stress compensating template, growing or depositing the single crystal GaN structure, growing or depositing an active layer, growing or depositing the single crystal monoclinic gadolinium oxide dielectric layer, and growing or depositing the single crystal gadolinium silicide gate electrode are all performed in situ.

16. The method as claimed in claim 13 wherein the step of epitaxially growing the single crystal stress compensating template includes epitaxially growing one or more layers of single crystal rare earth oxide with different compositions of rare earth metals.

17. The method as claimed in claim 13 wherein the step of epitaxially growing the single crystal stress compensating template includes epitaxial growing a layer of rare earth oxide with a cubic crystal structure on the substrate, epitaxial growing a layer of silicon on the layer of rare earth oxide, and epitaxial growing a layer of AlN with a hexagonal crystal structure on the epitaxial layer of silicon.

18. The method as claimed in claim 13 wherein the active layer of single crystal III-N material has a hexagonal crystal structure and the rare earth oxide has a cubic crystal structure in bulk form whereby the single crystal monoclinic gadolinium oxide dielectric layer has a polymorphous crystal structure.

19. The method as claimed in claim 13 wherein the step of growing or depositing the single crystal gadolinium silicide includes adjusting the silicon and gadolinium metal to an atomic ratio in a range of 1.7 to 2.

20. The method as claimed in claim 19 wherein the step of growing or depositing the gadolinium includes adjusting the gadolinium to silicon to a ratio of $GdSi_{1.7}$.

* * * * *